United States Patent
Hess et al.

(10) Patent No.: US 7,489,151 B2
(45) Date of Patent: Feb. 10, 2009

(54) LAYOUT FOR DUT ARRAYS USED IN SEMICONDUCTOR WAFER TESTING

(75) Inventors: Christopher Hess, San Carlos, CA (US); Angelo Rossoni, Brescia (IT); Stefano Tonello, Breganze (IT); Michele Squicciarini, Noceto (IT); Michele Quarantelli, Noceto (IT)

(73) Assignee: PDF Solutions, Inc., San Jose, CA (US)

( * ) Notice: Subject to any disclaimer, the term of this patent is extended or adjusted under 35 U.S.C. 154(b) by 78 days.

(21) Appl. No.: 11/243,016

(22) Filed: Oct. 3, 2005

(65) Prior Publication Data

US 2007/0075718 A1    Apr. 5, 2007

(51) Int. Cl.
G01R 31/02    (2006.01)
G01R 31/26    (2006.01)

(52) U.S. Cl. .......................... 324/763; 438/18
(58) Field of Classification Search ................ 324/763
See application file for complete search history.

(56) References Cited

U.S. PATENT DOCUMENTS

| | | | | |
|---|---|---|---|---|
| 5,485,095 | A * | 1/1996 | Bertsch et al. | 324/537 |
| 6,844,751 | B2 * | 1/2005 | Marshall et al. | 324/765 |
| 6,873,173 | B2 * | 3/2005 | Kollmer et al. | 324/769 |
| 6,937,047 | B2 * | 8/2005 | Tran et al. | 324/763 |
| 7,253,093 | B2 * | 8/2007 | Lin et al. | 438/618 |
| 7,265,034 | B2 * | 9/2007 | Lu et al. | 438/463 |
| 7,332,921 | B2 * | 2/2008 | Nulty et al. | 324/762 |
| 7,378,290 | B2 * | 5/2008 | Cowles et al. | 438/18 |

OTHER PUBLICATIONS

Ohkawa, S. et al. (2003). "Analysis and Characterization of Device Variations in an LSI Chip Using an Integrated Device Matrix Array," *Proceedings of International Conference on Microelectronic Test Structures*, pp. 70-75.

Lefferts, R. et al. (2003). "An Integrated Test Chip for the Complete Characterization and Monitoring of a 0.25um CMOS Technology that Fits into Five Scribe Line Structures 150um by 5,000um," *Proceedings of International Conference on Microelectronic Test Structures*, pp. 59-63.

Quarantelli, M. et al. (2003). "Characterization and Modeling of MOSFET Mismatch of a Deep Submicron Technology," *Proceedings of International Conference on Microelectronic Test Structures*, pp. 238-243.

(Continued)

*Primary Examiner*—Ha Tran T Nguyen
*Assistant Examiner*—Roberto Velez
(74) *Attorney, Agent, or Firm*—Morrison & Foerster LLP

(57) ABSTRACT

A layout for devices under test formed on a semiconductor wafer for use in wafer testing includes a first array of devices under test and a first pad set formed adjacent to the first array. The first pad set includes a gate force pad, a source pad, and a drain pad. Each of the devices under test in the first array is connected to the gate pad of the first pad set. Each of the devices under test in the first array is connected to the source pad of the first pad set. Each of the devices under test in the first array is connected to the drain pad of the first pad set.

26 Claims, 11 Drawing Sheets

OTHER PUBLICATIONS

Saxena, S. et al. (Mar. 2004). "test Structures and Analysis Techniques for Estimation of the Impact of Layout on MOSFET Performance and Variability," *Proceedings of International Conference on Microelectronic Test Structures* 17:263-266.

Einfeld, J. et al. (Mar. 2004). "A New Test Circuit for the Matching Characterization of npn Bipolar Transistors," *Proceedings of International Conference on Microelectronic Test Structures* 17:127-131.

Yeric, G. et al. (2005). "Infrastructure for Successful BEOL Yield Ramp, Transfer to Manufacturing, and DFM Characterization at 65 nm and Below," *Proceedings of IEEE Design & Test of Computers*, pp. 232-239.

Schaper, U. et al. (Apr. 2005). "Parameter Variation on Chip Level," *Proceedings of International Conference on Microelectronic Test Structures* 18:155-158.

* cited by examiner

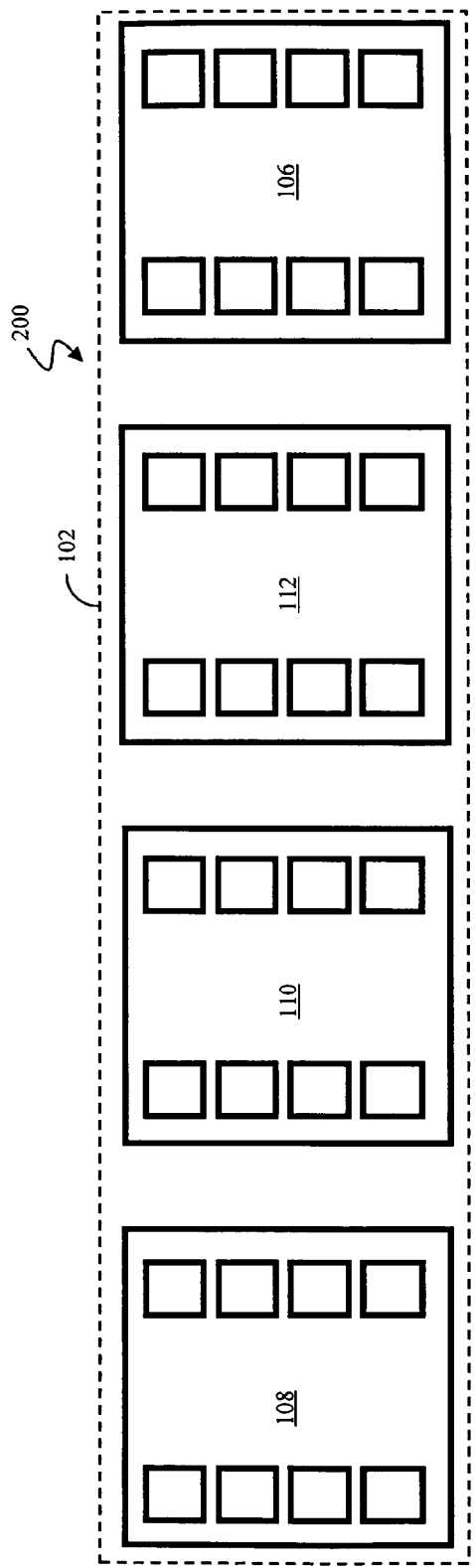
FIG. 2-A
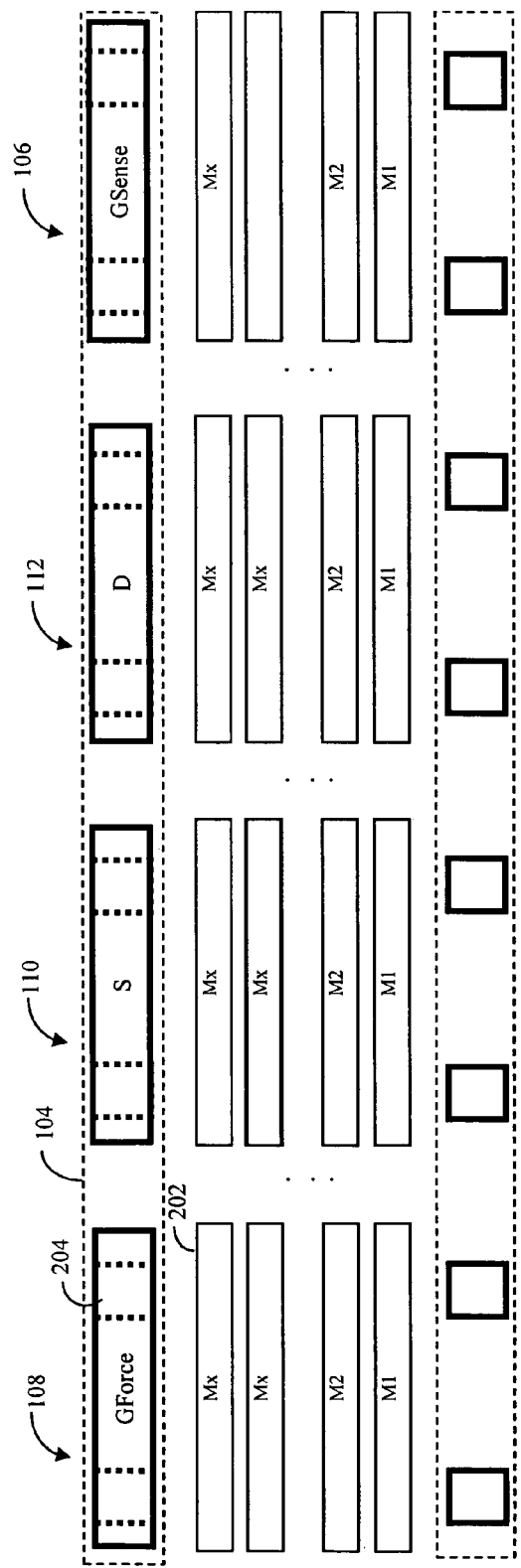
FIG. 2-B

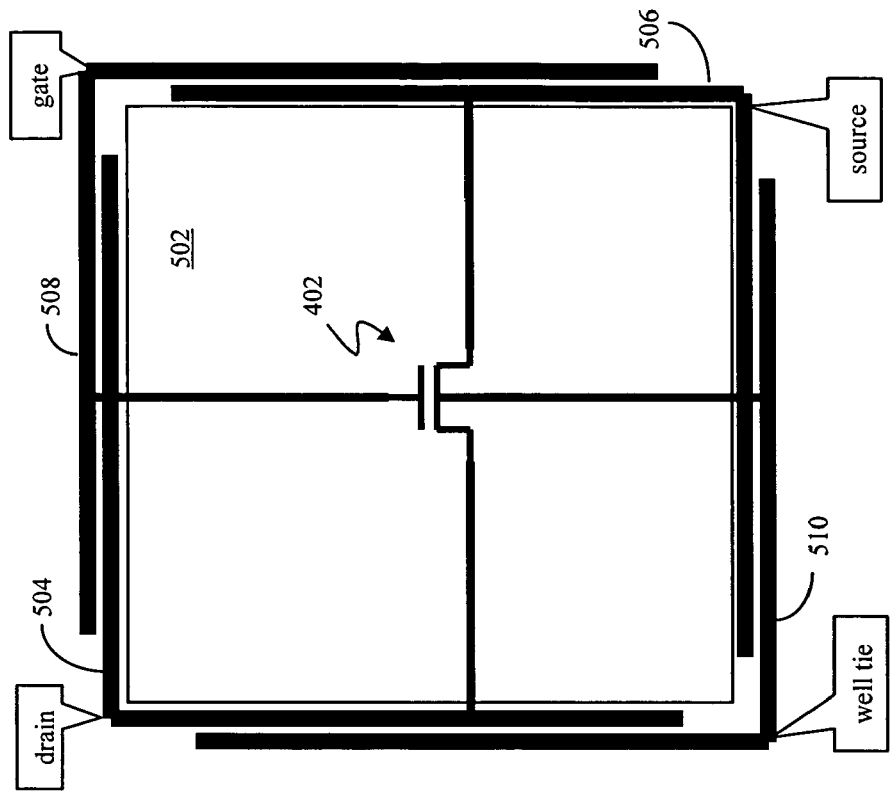
FIG. 5-B
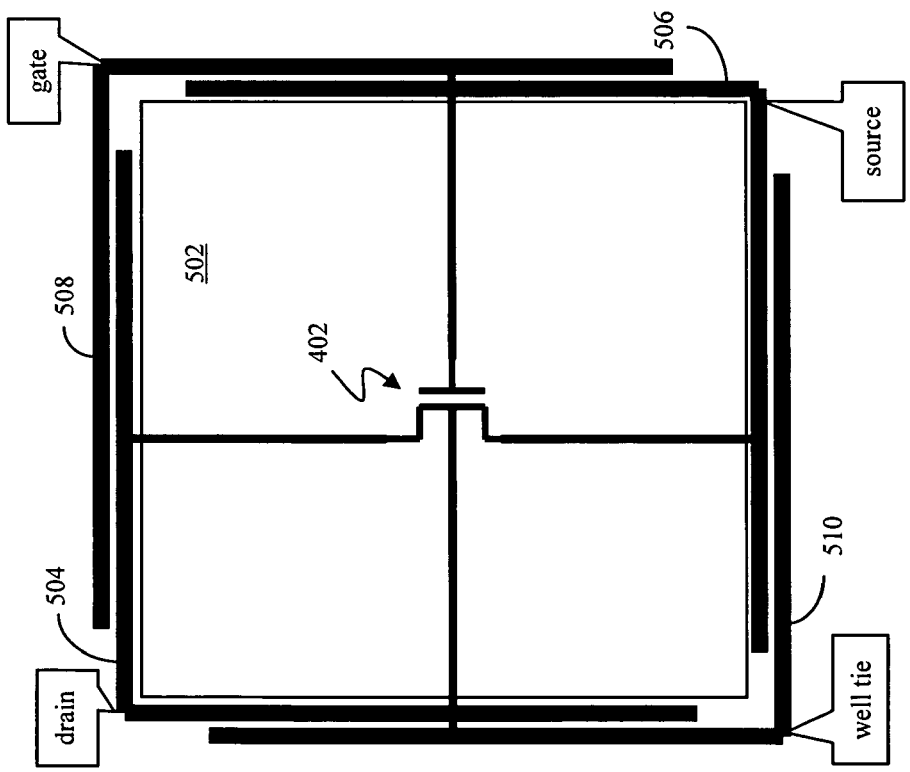
FIG. 5-A

LAYOUT FOR DUT ARRAYS USED IN SEMICONDUCTOR WAFER TESTING

BACKGROUND

1. Field

The present application generally relates to device under test (DUT) arrays, and, more particularly, to a layout for DUT arrays used in semiconductor wafer level testing.

2. Description of Related Art

To assist in evaluating and/or controlling a semiconductor fabrication process, integrated circuit devices are fabricated on a wafer as test devices. These test devices are referred to as devices under test (DUTs). Typically, a wafer with DUTs formed thereon is positioned within a wafer tester. The wafer tester has an array of probes that make electrical contact with contact pads for the DUTs on the wafer. The wafer tester then performs electrical testing of the DUTs.

Typically, each DUT on a wafer has one or more contact pads assigned to it. Thus, in order to test all the DUTs on the wafer, the wafer tester has to either have enough probes to make contact with all the contact pads of all the DUTs on the wafer or test groups of DUTs at a time. Thus, the number of DUTs on a wafer can be limited by the number of DUTs that can be tested within a reasonable amount of time using the wafer tester.

A variety of arrays of DUTs are in use today. For example, a CMOS device array for determining the variability of the drive current is disclosed in Ohkawa, S., Aoki, M., Masuda, H., "Analysis and Characterization of Device Variations in an LSI Chip Using an Integrated Device Matrix Array", Proc. International Conference on Microelectronic Test Structures (ICMTS), pp 70-75, 2003, which is incorporated by reference herein. However, in this array, the DUTs are measured in sequence, which is very slow. Also, device parameters like the threshold voltage cannot be measured due to the large array size. Furthermore, this approach cannot be ported into a scribe line.

Another array of various DUTs is disclosed in Leffers, R., Jakubiec, A., "An Integrated Test Chip for the Complete Characterization and Monitoring of a 0.25 um CMOS Technology that fits into five scribe line structures 150 um by 5000 um", Proc. International Conference on Microelectronic Test Structures (ICMTS), pp 59-63, 2003, which is incorporated by reference herein. This array, however, requires a customized probe card with an operational amplifier connected to certain pins. Additionally, all measurements are done in sequence and there are force and sense pads required for both source and drain.

Another array of CMOS devices is disclosed in Quarantelli, M., Saxena, S., Dragone, N., Babcock, J. A., Hess, C., Minehane, S., Winters, S., Chen, J., Karbasi, H., Guardiani, C., "Characterization and Modeling of MOSFET Mismatch of a Deep Submicron Technology", Proc. International Conference on Microelectronic Test Structures (ICMTS), Monterey (USA), 2003, which is incorporated by reference herein. In this array, there are selection devices on the drain path, which increases routing resistance significantly, and there will be a noticeable voltage drop if multiple devices are measured in parallel to save test time. Similar limitations exist for the CMOS device array disclosed in Saxena, S., Minehane, S., Cheng, J., Sengupta, M., Hess, C., Quarantelli, M., Kramer, G. M., Redford, M., "Test Structures and Analysis Techniques for Estimation of the Impact of Layout on MOSFET Performance and Variability", Proc. International Conference on Microelectronic Test Structures (ICMTS), Hyogo (Japan), 2004, which is incorporated by reference herein. Additionally, these arrays do not fit into a scribe line, as may be desired.

An array of bipolar devices is disclosed in Einfeld, J., Schaper, U., Kollmer, U., Nelle, P., Englisch, J., Stecher, M., "A New Test Circuit for the Matching Characterization of npn Bipolar Transistors", Proc. International Conference on Microelectronic Test Structures (ICMTS), Hyogo (Japan), 2004, which is incorporated by reference herein. In this array, there are selection devices to all DUT pins (in this case base, emitter and collector) and measurements are executed in sequence, which is a slow process.

Another array of CMOS used to determine parameter variation of devices is disclosed in Schaper, U., Einfeld, J., Sauerbrey, A., "Parameter Variation on Chip Level", Proc. International Conference on Microelectronic Test Structures (ICMTS), pp 155-158, 2005, which is incorporated by reference herein. In this array, each transistor is addressed by a decoder and measured individually in sequence.

In addition, there are also SRAM or ROM based arrays disclosed in DeBord, J. R. D., Grice, T., Garcia, R., Yeric, G., Cohen, E., Sutandi, A., Garcia, J., Green, G., "Infrastructure for Successful BEOL Characterization and Yield Ramp at the 65 nm Node and Below, Proc. IITC 2005, which is incorporated by reference herein. These arrays, however, are not used to extract variation of device related parameters like drive current or threshold voltage.

SUMMARY

In one exemplary embodiment, a layout for devices under test formed on a semiconductor wafer for wafer testing includes a first array of devices under test and a first pad set formed adjacent to the first array. The first pad set includes a gate force pad, a source pad, and a drain pad. Each of the devices under test in the first array is connected to the gate pad of the first pad set. Each of the devices under test in the first array is connected to the source pad of the first pad set. Each of the devices under test in the first array is connected to the drain pad of the first pad set.

DESCRIPTION OF DRAWING FIGURES

The present application can be best understood by reference to the following description taken in conjunction with the accompanying drawing figures, in which like parts may be referred to by like numerals:

FIG. 1 depicts an exemplary layout of devices under test in accordance with one exemplary embodiment;

FIG. 2-A depicts another exemplary layout of devices under test in accordance with another exemplary embodiment;

FIG. 2-B depicts a cross-sectional side view of FIG. 2-A;

Figure 6:
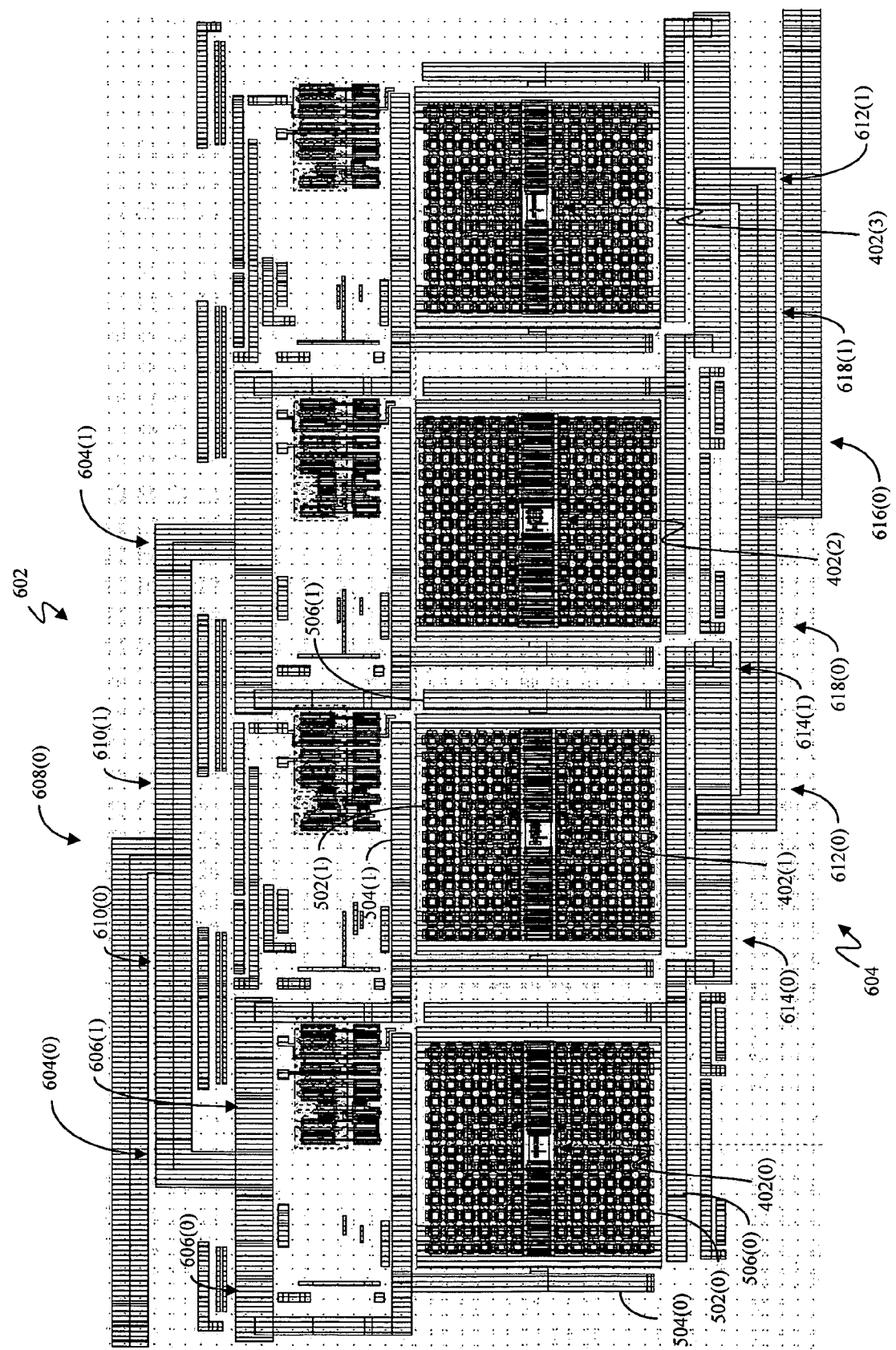
Figure 7:
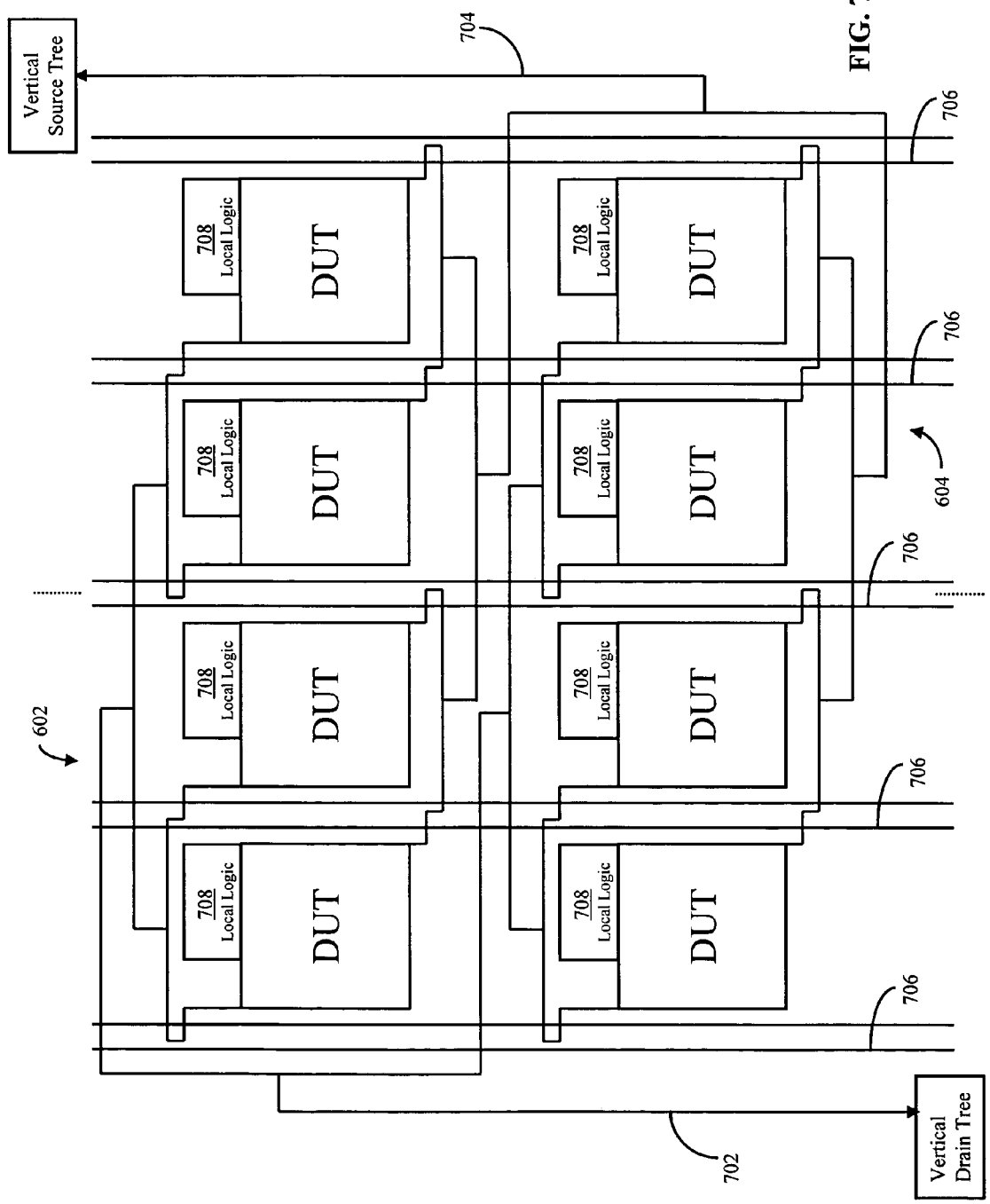
Figure 8:
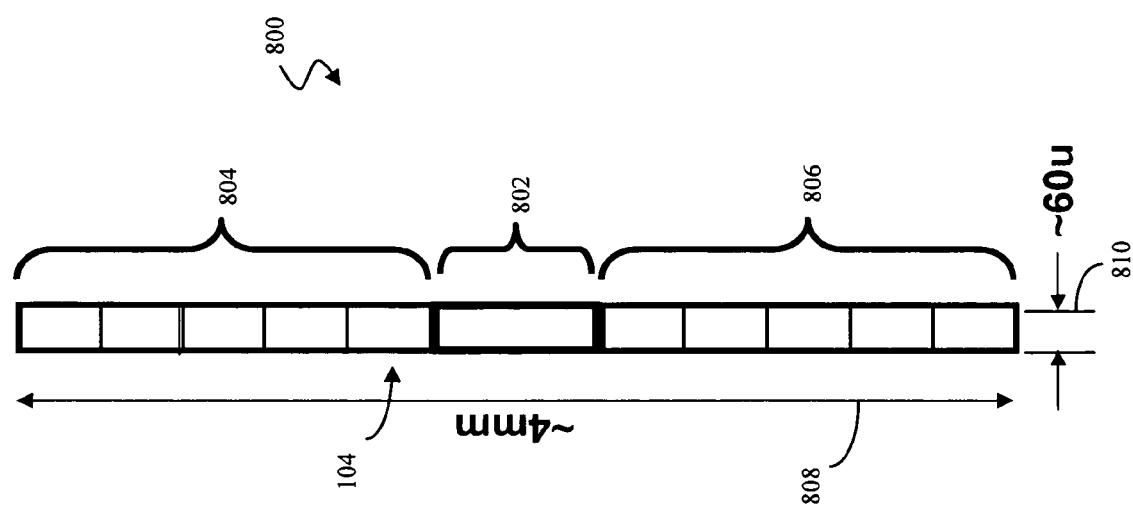
Figure 9:
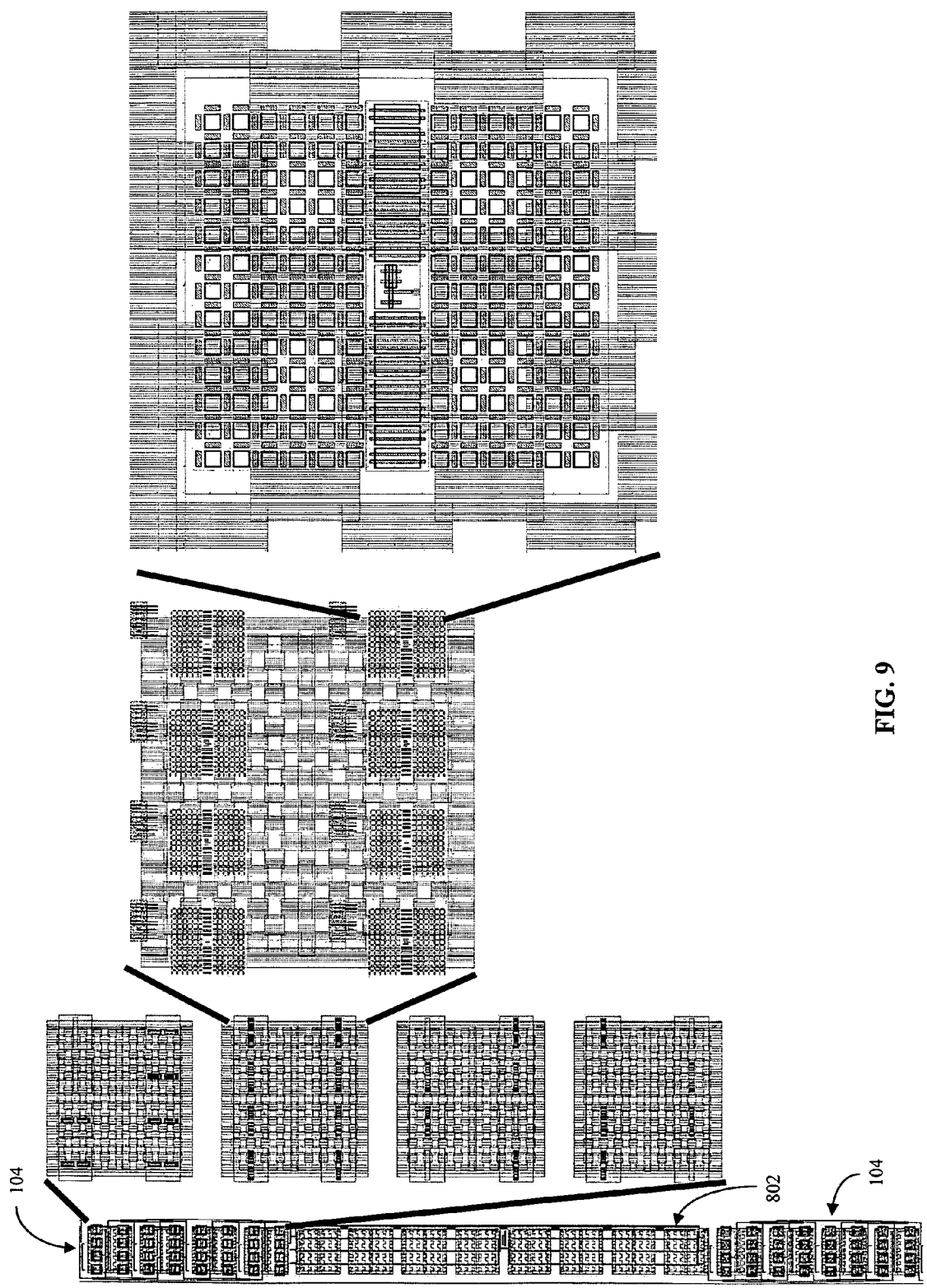
Figure 10:
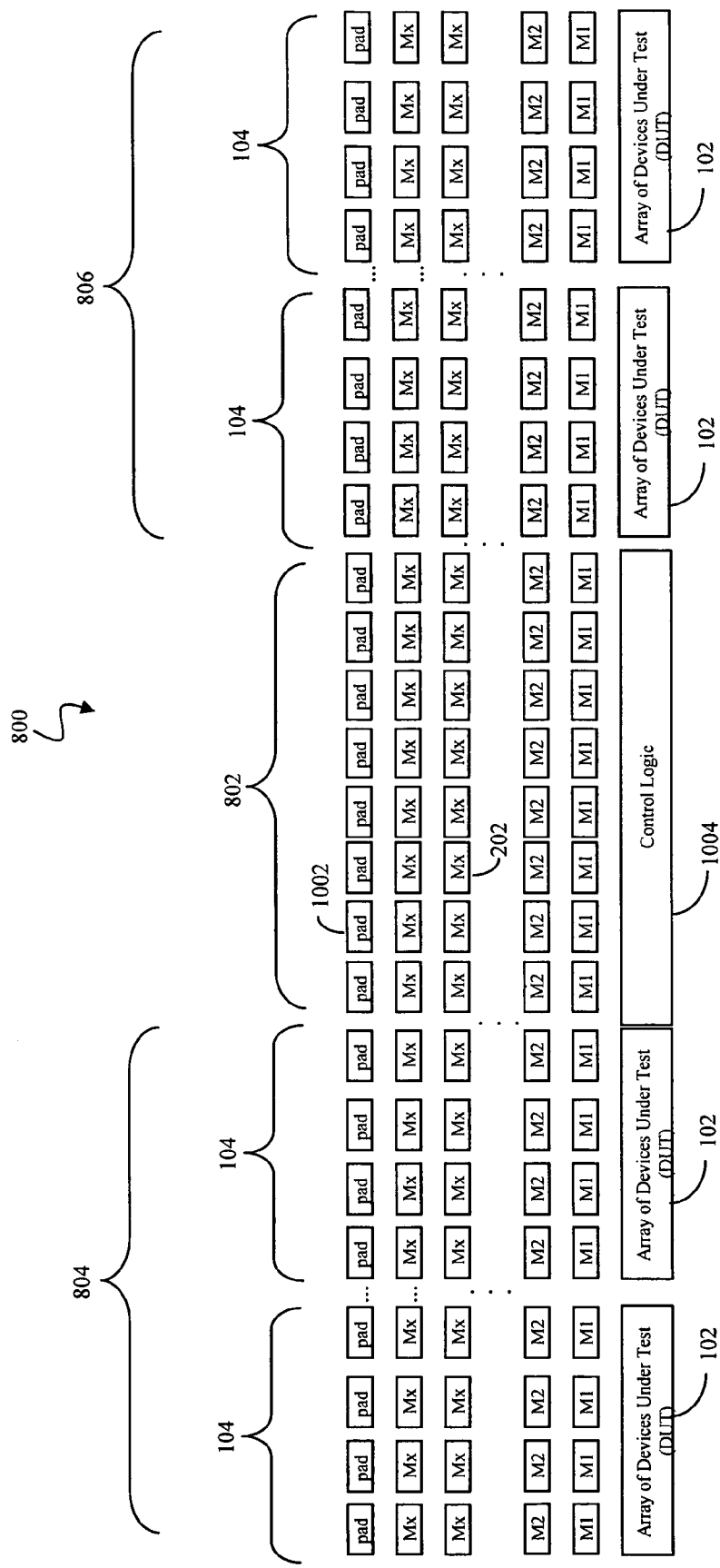

FIGS. 5-A and 5-B depict exemplary routing connections for a device under test;

FIG. 6 depicts exemplary tree routing structures for devices under test;

FIG. 7 depicts rows of devices under test connected to tree routing structures;

FIG. 8 depicts an exemplary pad frame in accordance with an exemplary embodiment;

FIG. 9 depicts a portion of the pad frame depicted in FIG. 8;

FIG. 10 depicts a cross section of FIG. 9; and

Figure 11:
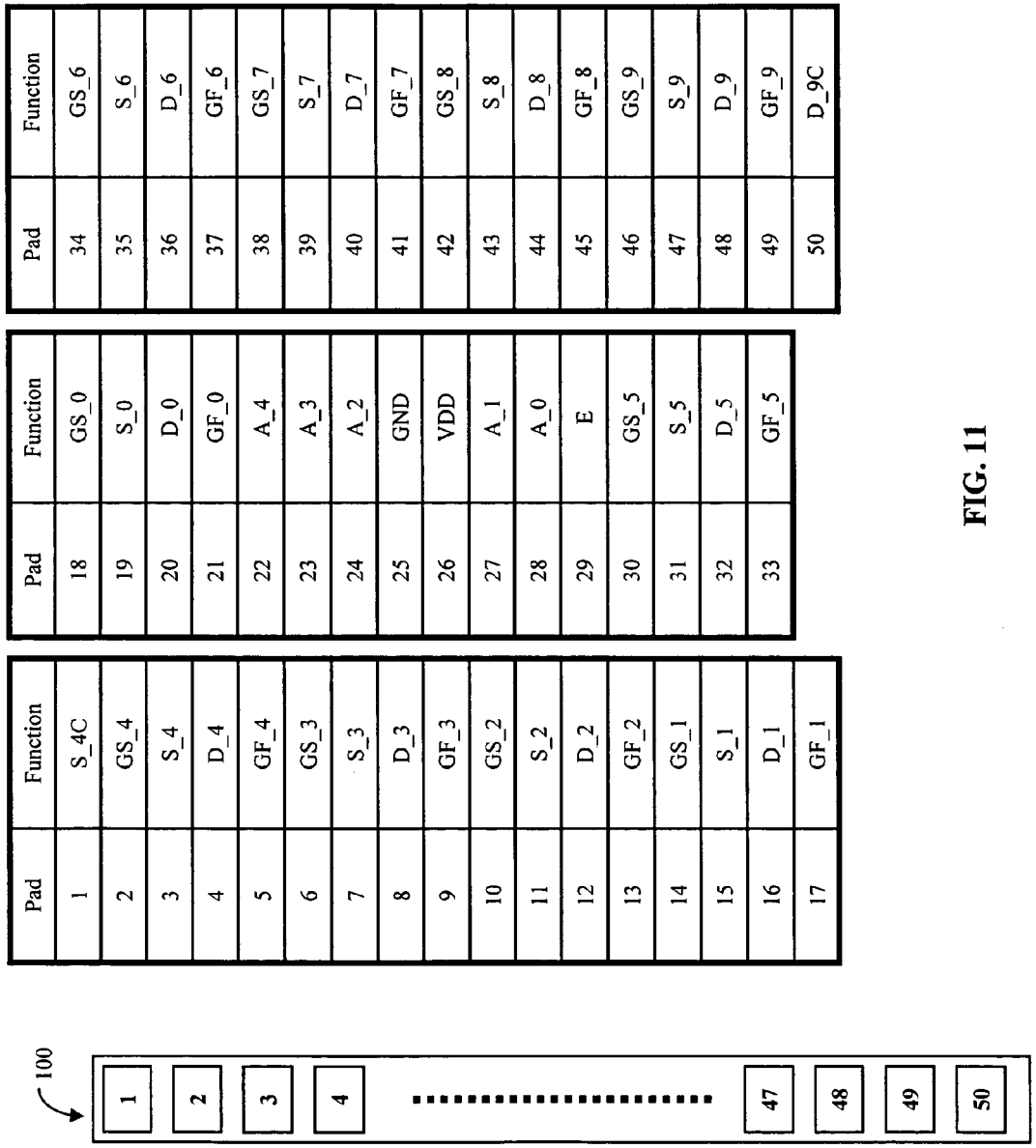

FIG. 11 depicts an exemplary pad mapping of a pad frame.

DETAILED DESCRIPTION

Devices and/or structures may be described herein using absolute and/or relative directions and orientations. It is to be understood that such directions and orientations are merely exemplary and for aiding in concise description, but in no way limiting as to how devices and/or structures may be disposed or formed.

Figure 1:
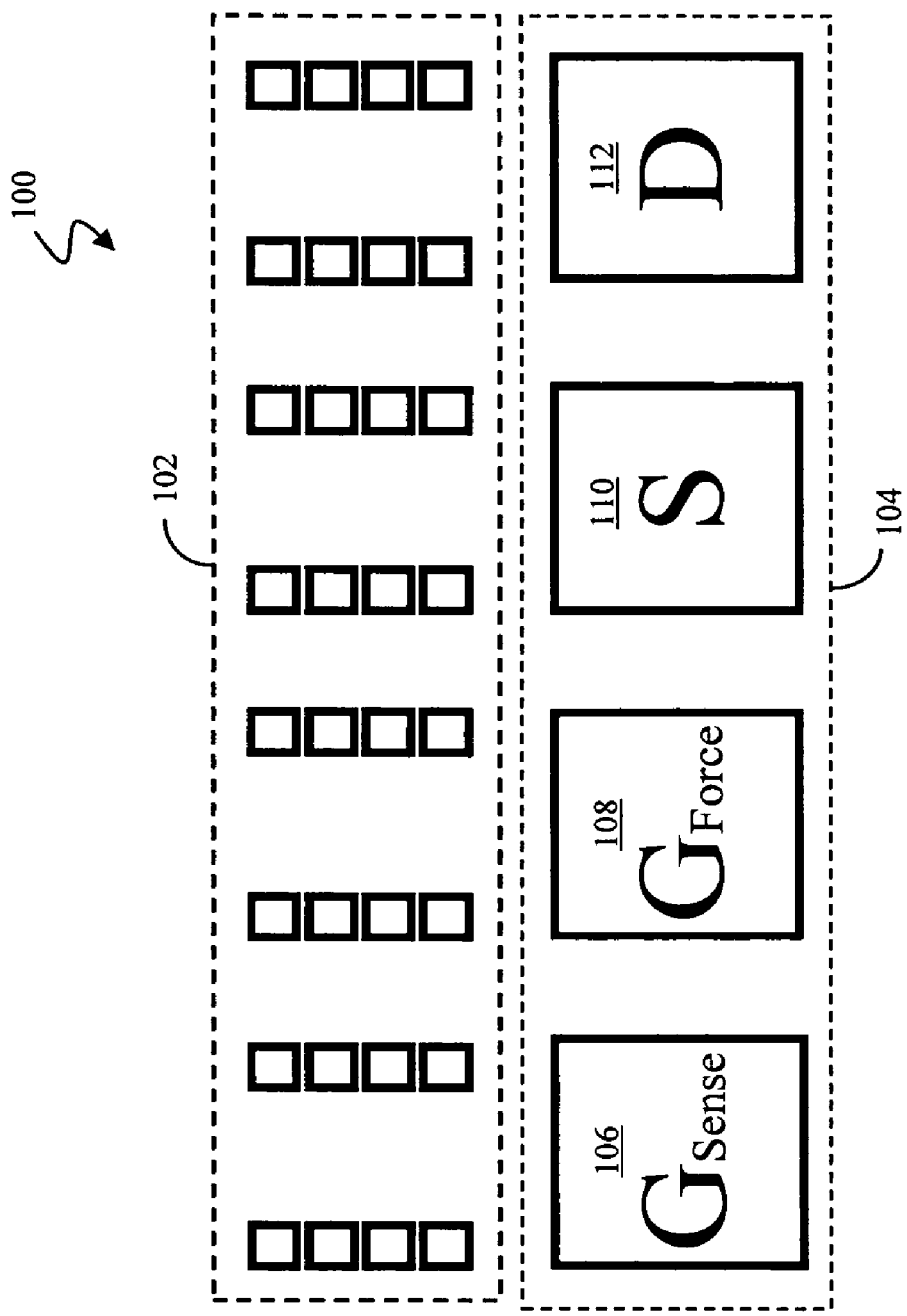

With reference to FIG. 1, in one exemplary embodiment, an exemplary layout 100 of devices under test (DUTs) is fabricated in an area on a semiconductor wafer. In the present exemplary embodiment, layout 100 includes a DUT array 102 arranged in rows and columns. Although FIG. 1 depicts 32 DUTs arranged in four rows and eight columns, it should be recognized that DUT array 102 can include any number of DUTs arranged in any number of rows and columns, including a single row or column.

Layout 100 also includes a pad set 104 formed adjacent to DUT array 102. In particular, in the present exemplary embodiment, pad set 104 includes a gate sense pad 106, a gate force pad 108, a source pad 110, and a drain pad 112. Each DUT in DUT array 102 is connected to gate sense pad 106, gate force pad 108, source pad 110, and drain pad 112 of pad set 104. As described in greater detail below, layout 100 can be formed without gate sense pad 106. Thus, pad set 104 can include only gate force pad 108, source pad 110, and drain pad 112.

In the present exemplary embodiment, pad set 104 is formed laterally adjacent to DUT array 102. Layout 100 can be formed in an area on a wafer using a 2 metal layer front end-of-line (FEOL) short flow process. It should be recognized, however, that layout 100 can be formed using various processes.

After layout 100 has been formed, each DUT in DUT array 102 is electrically tested on the wafer using a wafer tester. In particular, in the present exemplary embodiment, probes on the wafer tester contact gate sense pad 106, gate force pad 108, source pad 110, and drain pad 112, then test each DUT in DUT array 102 individually in series. As noted above, layout 100 can be formed without gate sense pad 106, in which case, probes on the wafer tester contact gate force pad 108, source pad 110, and drain pad 112, then test each DUT in DUT array 102 individually in series. In the present exemplary embodiment, the DUTs in DUT array 102 are sequentially tested. It should be recognized, however, that the DUTs in DUT array 102 can be tested individually in series in any desired order.

With reference to FIGS. 2-A and 2-B, in another exemplary embodiment, an exemplary layout 200 of DUTS is formed with pad set 104 formed adjacent to DUT array 102. In the present exemplary embodiment, layout 200 includes pad array 104 formed vertically adjacent, above, DUT array 102. In particular, as depicted in FIG. 2-B, DUT array 102 is formed in one layer on a wafer. Pad array 104 is formed in another layer on the wafer stacked above the layer in which DUT array 102 was formed. As also depicted in FIG. 2-B, any number of metal layers 202 can be formed between the layers in which DUT array 102 and pad array 104 are formed to interconnect the DUTs in DUT array 102 and gate sense pad 106, gate force pad 108, source pad 110, and drain pad 112 in pad array 104.

As also depicted in FIG. 2-B, in the present exemplary embodiment, gate sense pad 106, gate force pad 108, source pad 110, and drain pad 112 include holes 204 that align over the DUTs in DUT array 102. Holes 204 are sized to be larger than the DUTs in DUT array 102 to prevent random covering of DUTs in DUT array 102, which can cause matching and measurement errors. It should be recognized that metal layer 202 can also be routed to prevent random covering of DUTs in DUT array 102.

Figure 3:
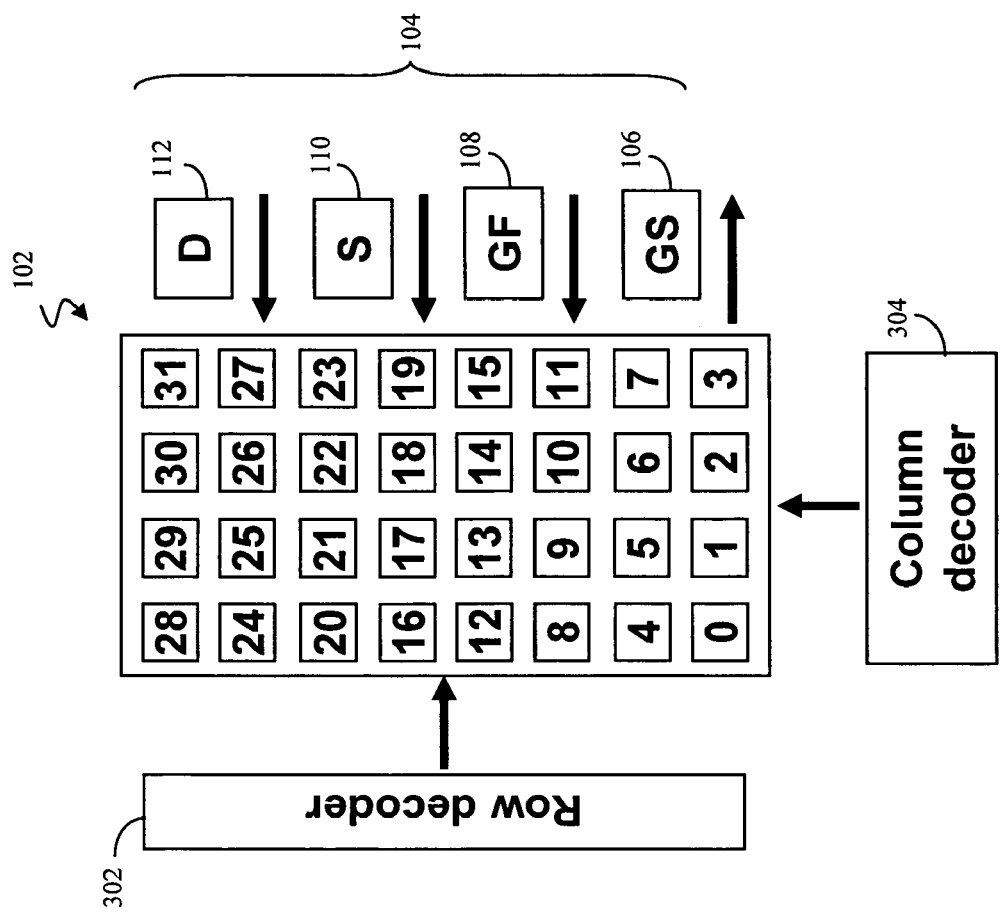
FIG. 3 depicts an exemplary addressing and routing scheme for an array of devices under test.

FIG. 3 depicts an exemplary addressing and routing scheme for DUT array 102. In the present exemplary embodiment, DUT array 102 includes 32 DUTs sequentially addressed from the bottom left corner of DUT array 102 to the upper right corner of DUT array 102. It should be recognized, however, that various addressing schemes may be used.

A row decoder 302 and a column decoder 304 can be used to individually address each DUT in DUT array 102. In the present exemplary embodiment, each DUT in DUT array 102 is tested using row decoder 302, column decoder 304 to individually address each DUT in DUT array 102. For example, row decoder 302 and column decoder 304 can be used to first address DUT (0) in DUT array 102. Pad array 104 can then be used to test DUT (0). Row decoder 302 and column decoder 304 can then be used to address DUT (1) in DUT array 102. Pad array 104 can then be used to test DUT (1). In this manner, DUTs (2)-(31) can be individually addressed using row decoder 302 and column decoder 304, and then tested using pad array 104. Although the DUTs in DUT array 102 are sequentially addressed and tested in this example, it should be recognized that the DUTs can be addressed and tested in any desired order.

Figure 4:
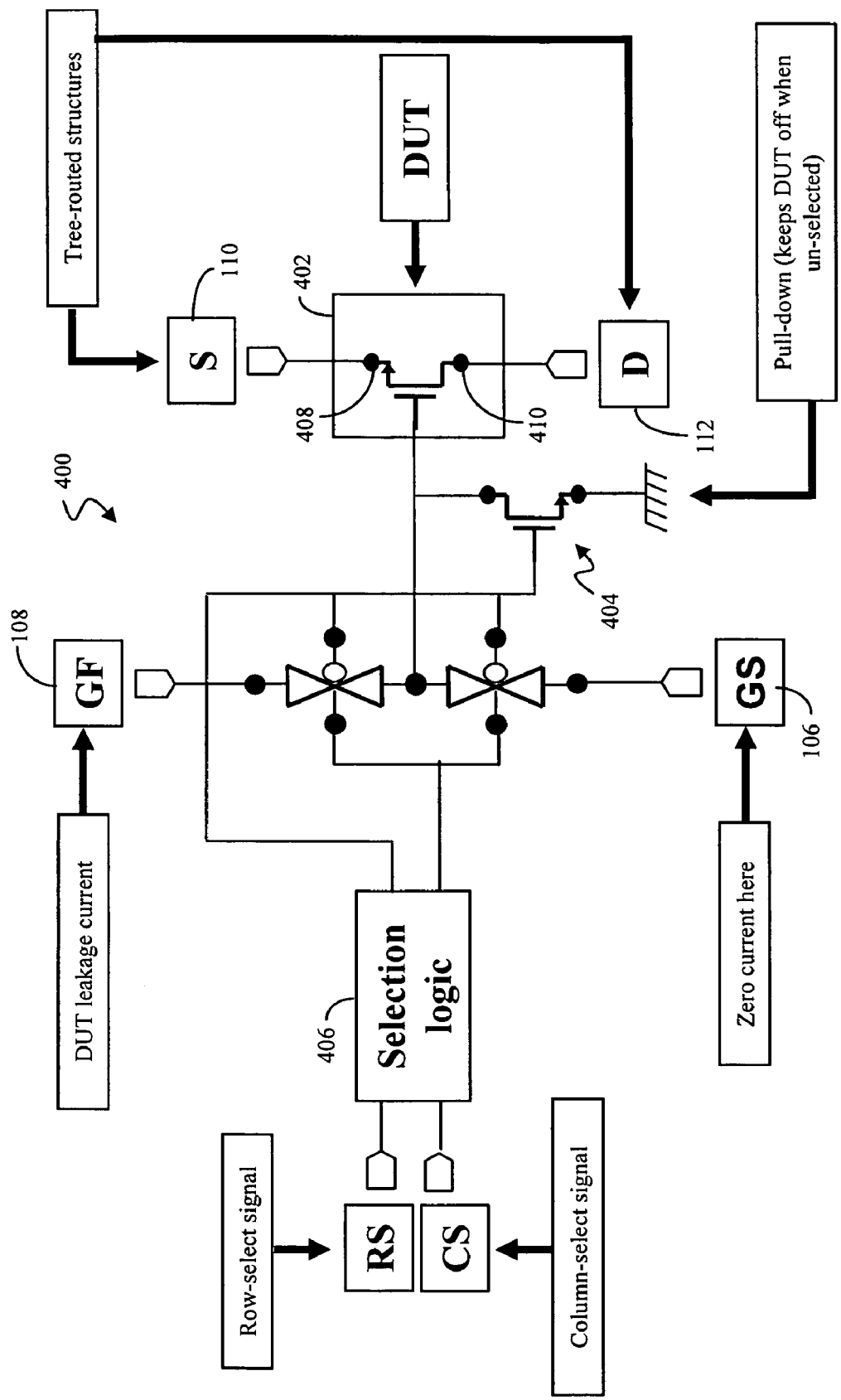
FIG. 4 depicts an exemplary core structure for a device under test.

FIG. 4 depicts an individual DUT 402 connected to source pad 110, drain pad 112, gate force pad 108, and gate sense pad 106. For the sake of example, DUT 402 is depicted as an NMOS transistor. It should be recognized, however, that DUT 402 can be various types of devices.

FIG. 4 depicts the source and drain of DUT 402 connected to source pad 110 and drain pad 112, respectively, through tree-routed structures, which will be described in greater detail below. In the present exemplary embodiment, the sources of all the DUTs in a particular DUT array are connected in parallel to source pad 110 through a source tree routing structure, which will be described in greater detail below. Additionally, the drains of all the DUTs in a particular DUT array are connected in parallel to drain pad 112 through a drain tree routing structure, which will be described in greater detail below. Thus, during electrical testing, probes in contact with source pad 110 and drain pad 112 can send and receive signals to and from all the DUTs in a DUT array at one time in parallel.

FIG. 4 also depicts the gate of DUT 402 connected to gate force pad 108 and gate sense pad 106 through a selection circuit 400. In the present exemplary embodiment, the gates of all the DUTs in a particular DUT array are connected to gate force pad 108 and gate sense pad 106 through selection circuit 400. Thus, during electrical testing, probes in contact with gate force pad 108 and gate sense pad 106 are connected to one DUT in a DUT array at a time through selection circuit 400. Each DUT in the DUT array is then selected for testing. As noted above, the gate sense pad 106 can be eliminated in some applications, such as when the gate leakage is negligible.

To test each DUT in a DUT array, selection circuit 400 is used to select each DUT addressed by row and column selection signals. As depicted in FIG. 4, selection circuit 400 includes selection logic 406 that receives a row selection signal and a column selection signal. Thus, selection circuit 400 connects the gate of a particular DUT in the DUT array to the gate force pad 108 and gate sense pad 106 to test the particular DUT. As also depicted in FIG. 4, the gate of DUT 402 is also connected to a pull-down transistor 404 that keeps DUT 402 turned off when it is unselected. Note, depending on the polarity of DUT 402, a pull-up transistor may be used instead.

In the present exemplary embodiment, selection circuit 400 also includes a mode to turn off all DUTs in a DUT array to measure an off condition of the DUTs in the DUT array. To invoke this mode, a global enable signal can be connected to control column decoder 304 (FIG. 3). For example, when a global enable pin is tied to ground, all the DUTs are turned off by forcing the output of column decoder 304 (FIG. 3) to zero. An off condition current ($I_{off}$) measurement can then be obtained for the DUTs in the DUT array.

FIG. 5-A depicts an exemplary routing connection for DUT 402. As depicted in FIG. 5-A, DUT 402 is disposed within a cell 502. In the present exemplary embodiment, a first L-shaped routing structure 504 is disposed at a first corner of cell 502. As depicted in FIG. 5-A, first L-shaped routing structure 504 is connected to the drain of DUT 402. A second L-shaped routing structure 506 is disposed at a second corner of cell 502. As depicted in FIG. 5-A, second L-shaped routing structure 506 is connected to the source of DUT 402. A third L-shaped routing structure 508 is disposed at a third corner of cell 502. As depicted in FIG. 5-A, third L-shaped routing structure 508 is connected to the gate of DUT 402. A fourth L-shaped routing structure 510 is disposed at a fourth corner of cell 502. As depicted in FIG. 5, fourth L-shaped routing structure 510 is connected to the well of DUT 402. As depicted in FIG. 5-B, DUT 402 can be rotated 90 degrees while using the same routing connections.

FIG. 6 depicts an exemplary tree routing structure for connecting together in parallel drains and sources of multiple DUTs in a DUT array. In the present exemplary embodiment, the drains of multiple DUTs are connected together in parallel using a drain tree routing structure 602, and the sources of multiple DUTs are connected together in parallel using a source tree routing structure 604.

As depicted in FIG. 6, the drains of two adjacent DUTs are connected together in parallel using one branch of drain tree routing structure 602. For example, assume the drain of DUT 402(0) is connected to L-shaped routing structure 504(0) disposed at a corner of cell 502(0), and the drain of DUT 402(1) is connected to L-shaped routing structure 504(1) disposed at a corner of cell 502(1). As depicted in FIG. 6, a branch 604(0) in a first hierarchy of drain tree routing structure 602 connects together in parallel the drains of DUT 402(0) and DUT 402(1). In particular, branch 604(0) includes a segment 606(0) connected to L-shaped routing structure 504(0) and a segment 606(1) connected to L-shaped routing structure 504(1). In the present exemplary embodiment, segments 606(0) and 606(1) of branch 604(0) are electrically balanced. For example, the dimensions and electrical characteristics of segments 606(0) and 606(1) can be made to be the same. In a similar manner, another branch 604(1) in the first hierarchy of drain tree routing structure 602 connects together in parallel the drains of DUT 402(2) and DUT 402(3).

As depicted in FIG. 6, a branch 608(0) in the second hierarchy of drain tree routing structure 602 connects together in parallel branches 604(0) and 604(1) to connect together in parallel the drains of DUTs 402(0), 402(1), 402(2), and 402(3). In particular, branch 608(0) includes a segment 610(0) connected to branch 604(0) and a segment 610(1) connected to branch 604(1). In the present exemplary embodiment, segments 610(0) and 610(1) are electrically balanced. For example, the dimensions and electrical characteristics of segments 610(0) and 610(1) can be made to be the same. In this manner, the drains of any number of DUTs can be connected together in parallel using an appropriate number of branches and hierarchies of drain tree routing structure 602.

As depicted in FIG. 6, the sources of two adjacent DUTs are connected together in parallel using one branch of source tree routing structure 604. For example, assume the source of DUT 402(0) is connected to L-shaped routing structure 506(0) disposed at a corner of cell 502(0), and the source of DUT 402(1) is connected to L-shaped routing structure 506(1) disposed at a corner of cell 502(1). As depicted in FIG. 6, a branch 612(0) in a first hierarchy of source tree routing structure 604 connects together in parallel the sources of DUT 402(0) and DUT 402(1). In particular, branch 612(0) includes a segment 614(0) connected to L-shaped routing structure 506(0) and a segment 614(1) connected to L-shaped routing structure 506(1). In the present exemplary embodiment, segments 614(0) and 614(1) of branch 612(0) are electrically balanced. For example, the dimensions and electrical characteristics of segments 614(0) and 614(1) can be made to be the same. In a similar manner, another branch 612(1) in the first hierarchy of source tree routing structure 604 connects together in parallel the sources of DUT 402(2) and DUT 402(3).

As depicted in FIG. 6, a branch 616(0) in the second hierarchy of source tree routing structure 604 connects together in parallel branches 612(0) and 612(1) to connect together in parallel the sources of DUTs 402(0), 402(1), 402(2), and 402(3). In particular, branch 616(0) includes a segment 618(0) connected to branch 612(0) and a segment 618(1) connected to branch 612(1). In the present exemplary embodiment, segments 618(0) and 618(1) are electrically balanced. For example, the dimensions and electrical characteristics of segments 618(0) and 618(1) can be made to be the same. In this manner, the sources of any number of DUTs can be connected together in parallel using an appropriate number of branches and hierarchies of source tree routing structure 604.

Thus, in the present exemplary embodiment, the drains of each DUT in a row of DUTs in a DUT array are connected together in parallel in a first hierarchy of drain tree routing structure 602. Similarly, the sources of each DUT in a row of DUTs in a DUT array are connected together in parallel in a first hierarchy of source tree routing structure 604.

FIG. 7 depicts rows of DUTs stacked in a DUT array. As depicted in FIG. 7, drain tree routing structures 602 of multiple rows of DUTs are connected together in parallel into a vertical drain tree 702 on one side. Source tree routing structures 604 of multiple rows of DUTs are connected together in parallel into a vertical source tree 704 on another side. In FIG. 7, vertical drain tree 702 is depicted as being on the left side, and vertical source tree 704 is depicted as being on the right side. As noted above, it should be recognized that these orientations are relative, and that location of vertical drain tree 702 and vertical source tree 704 can be switched.

FIG. 7 also depicts routing lines 706 running vertically between columns of DUTS in a DUT array. In the present embodiment, routing lines 706 can carry power supply, gate force, gate sense, and selection signals.

With reference to FIG. 8, in another exemplary embodiment, an exemplary pad frame 800 having a pad set 802 of pads for control logic disposed between multiple DUT arrays is fabricated. In the present exemplary embodiment, pad frame 800 includes a superset 804 of five pad sets 104 for five DUT arrays 102 disposed on one side of pad set 802, and a superset 806 of five pad sets 104 for five DUT arrays disposed on another side of pad set 802.

In the present exemplary embodiment, the DUTs of DUT arrays corresponding to supersets 804 and 806 are different types of DUTs representing two types of experiments to be performed. For example, the DUTs of DUT arrays corresponding to superset 804 are NMOS-type DUTs, while the DUTS of DUT arrays corresponding to superset 806 are PMOS-type DUTs. It should be recognized that supersets 804 and 806 can correspond to any number of DUT arrays 102 with any number of different types of DUTs.

As depicted in FIG. 8, pad set 802 and supersets 804 and 806 can be arranged linearly. In the present exemplary embodiment, pad frame 800 has a height 808 of approximately 4 millimeters and a width 810 of about 60 microns. It should be recognized, however, that pad frame 800 can have various dimensions.

In the present exemplary embodiment, pad frame 800 is formed in a scribe line between IC dice on a wafer. Pad frame 800 and the IC dice are formed on the wafer using an IC fabrication line. After the pad frame 800 and IC dice are formed on the wafer, the DUTs in the DUT arrays of pad frame 800 in the scribe line are tested. After the DUTs are tested, the IC dice are diced along scribe lines into IC chips. The IC chips are then packaged. It should be recognized, however, that pad frame 800 can be formed in any area on a wafer.

FIG. 9 depicts a portion of pad frame 800 in greater detail. In particular, FIG. 9 depicts pad set 802 having 8 pads disposed between one pad set 104 on one side and another pad set 104 on another side. As also depicted in FIG. 9, pad set 104 includes 4 pads, and each pad having 8 DUTs disposed below the pad. Thus, each pad set 104 is disposed above 32 DUTs.

FIG. 10 depicts a portion of pad frame 800 in cross section. As depicted in FIG. 10, pads 1002 of pad frame 800 are formed above DUT arrays 102 and control logic 1004. In particular, as depicted in FIG. 10, DUT arrays 102 and control logic 1004 are formed in one layer on a wafer. Pads 1002 are formed in another layer on the wafer above the layer in which DUT arrays 102 and control logic 1004 was formed. As also depicted in FIG. 10, any number of metal layers 202 can be formed between the layer in which DUT array 102 and control logic 1004 and the layer in which pads 1002 are formed to interconnect the DUTs in DUT arrays 102, control logic 1004, and pads 1002.

FIG. 11 depicts an exemplary pad mapping for pad frame 800. In the present exemplary embodiment, pad frame 800 includes 50 pads. As depicted in FIG. 11, pads 22-29 are mapped to provide power and control signals to the DUT arrays in pad frame 800. Pads 18-21 correspond to a pad set for a first DUT array. Pads 14-17 correspond to a pad set for a second DUT array. Pads 10-13 correspond to a pad set for a third DUT array. Pads 6-9 correspond to a pad set for a fourth DUT array. Pads 2-5 corresponds to a pad set for a fifth DUT array. Pads 30-33 correspond to a pad set for a sixth DUT array. Pads 34-37 corresponds to a pad set for a seventh DUT array. Pads 38-41 correspond to a pad set for an eight DUT array. Pads 42-45 correspond to a pad set for a ninth DUT array. Pads 46-49 correspond to a tenth DUT array. As noted above, in the present exemplary embodiment, the first-fifth DUT arrays (pads 2-21 of pad frame 800) are used for NMOS DUTs, while the sixth-tenth DUT arrays (pads 3049 of pad frame 800) are used for PMOS DUTs.

With reference to FIG. 10, control logic 1004 is configured to test each DUT in a DUT array individually in series. In the present exemplary embodiment, control logic 1004 is configured to test all the DUT arrays 102 of pad frame 800 in parallel. Thus, ten DUTs (one DUT from each of the first-tenth DUT arrays of pad frame 800) are tested at one time in parallel. Additionally, in the present exemplary embodiment, DUTs in the same array location in each of the first-tenth DUT arrays of pad frame 800 are tested at one time.

For example, assume that DUTs in each of the first-tenth DUT arrays of pad frame 800 are arranged and addressed in the manner depicted in FIG. 3. Thus, in the present exemplary embodiment, with reference to FIG. 3, DUTs (0) in each of the first-tenth DUT arrays of pad frame 800 (FIG. 10) are tested at one time in parallel. After DUTs (0) are tested, DUTs (1) in each of the first-tenth DUT arrays of pad frame 800 (FIG. 10) are then tested at one time in parallel. As noted above, it should be recognized that the DUTs in the DUT arrays of pad frame 800 (FIG. 10) can be tested individually in series in any desired order.

With reference again to FIG. 10, in the present exemplary embodiment, pad 1 and pad 50 of pad frame 800 are used as calibration pads used to measure source and drain resistance. In particular, with reference to FIG. 4, the source resistance can be measured at measurement point 408, and the drain resistance can be measured at measurement point 410. With reference to FIG. 11, it should be recognized that pads 1 and pad 50 can be left as non-functional pads.

With reference to FIG. 10, in the present exemplary embodiment, control logic 1004 can include a portion of selection circuit 400 (FIG. 4) to select individual DUTs in DUT array 102 for testing. In particular, logic 1004 includes the global portion of selection circuit 400 (FIG. 4). With reference to FIG. 7, the local portion of selection circuit 400 (FIG. 4) are disposed in local logic 708 disposed adjacent to each DUT.

Although exemplary embodiments have been described, various modifications can be made without departing from the spirit and/or scope of the present invention. Therefore, the present invention should not be construed as being limited to the specific forms shown in the drawings and described above.

We claim:

1. A layout for devices under test formed on a semiconductor wafer for use in wafer testing, the layout comprising:
   a first array of devices under test, wherein a device under test in the first array is formed within a cell, wherein the device under test includes a drain, source, gate, and well, and further comprising:
      a first L-shaped routing structure disposed at a first corner of the cell, wherein the first L-shaped routing structure is connected to the drain;
      a second L-shaped routing structure disposed at a second corner of the cell, wherein the second L-shaped routing structure is connected to the source;
      a third L-shaped routing structure disposed at a third corner of the cell, wherein the third L-shaped routing structure is connected to the gate; and
      a fourth L-shaped routing structure disposed at a fourth corner of the cell, wherein the fourth L-shaped routing structure is connected to the well;
   a first pad set formed adjacent to the first array, the first pad set including a gate force pad, a source pad, and a drain pad,
      wherein each of the devices under test in the first array is connected in parallel to the source pad of the first pad set, and
      wherein each of the devices under test in the first array is connected in parallel to the drain pad of the first pad set; and
   a selection circuit connected to each of the devices under test in the first array and the gate force pad, wherein the selection circuit is configured to selectively connect each of the devices under test in the first array to the gate force pad.

2. The layout of claim 1, wherein the first away and the first pad set are formed horizontally adjacent to each other on the wafer.

3. The layout of claim 1, further comprising:
a row decoder disposed adjacent to the rows of the first array; and
a column decoder disposed adjacent to the columns of the first array, wherein individual devices under test in the first away are independently addressable using the row decoder and column decoder.

4. The layout of claim 1, wherein each device under test in the first away includes a drain and a source, and further comprising:
a drain tree routing structure connected to the drains of each device under test in the first array, wherein the drain tree routing structure connects the devices under test in the first array in parallel to the drain pad; and
a source tree routing structure connected to the sources of each device under test in the first array, wherein the source tree routing structure connects the devices under test in the first array in parallel to the source pad.

5. The layout of claim 4, wherein the drain tree routing structure comprises:
a first branch at a first hierarchy of the drain tree routing structure, wherein the first branch includes a first segment connected to the drain of a first device under test and a second segment connected to the drain of a second device under test, wherein the first device under test is adjacent to the second device under test, and wherein the first and second segments of the first branch are electrically balanced.

6. The layout of claim 5, wherein the drain tree routing structure comprises:
a second branch at a first hierarchy of the drain tree routing structure, wherein the second branch includes a first segment connected to the drain of a third device under test and a second segment connected to the drain of a fourth device under test, wherein the third device under test is adjacent to the fourth device under test, and wherein the first and second segments of the second branch are electrically balanced.

7. The layout of claim 6, wherein the drain tree routing structure comprises:
a third branch at a second hierarchy of the drain tree routing structure, wherein the third branch includes first segment connected to the first branch and a second segment connected to the second branch, wherein the first branch is adjacent to the second branch, and wherein the first and second segments of the third branch are electrically balanced.

8. The layout of claim 7, wherein the source tree routing structure comprises:
a first branch at a first hierarchy of the source tree routing structure, wherein the first branch includes a first segment connected to the source of the first device under test and a second segment connected to the source of the second device under test, and wherein the first and second segments of the first branch are electrically balanced;
a second branch at a first hierarchy of the source tree routing structure, wherein the second branch includes a first segment connected to the source of the third device under test and the second segment connected to the source of a fourth device under test, and wherein the first and second segments of the second branch are electrically balanced; and
a third branch at a second hierarchy of the source tree routing structure, wherein the third branch includes first segment connected to the first branch and a second segment connected to the second branch, wherein the first branch is adjacent to the second branch, and wherein the first and second segments of the third branch are electrically balanced.

9. The layout of claim 8, wherein the first, second, third, and fourth devices under test are disposed within a row of the first array.

10. A layout for devices under test formed on a semiconductor wafer for use in wafer testing, the layout comprising:
a first array of devices under test;
a first pad set formed adjacent to the first array, the first pad set including a gate force pad, a source pad, and a drain pad,
wherein each of the devices under test in the first array is connected in parallel to the source pad of the first pad set,
wherein each of the devices under test in the first array is connected in parallel to the drain pad of the first pad set,
wherein the first array and the first pad set are formed vertically adjacent to each other on the wafer,
wherein the first array is formed in a first layer on the wafer, wherein the first pad set is formed in a second layer, wherein the second layer is formed above the first layer, and wherein the first pad set is formed above the first array, and
wherein each of the gate pad, the source pad, and the drain pad of the first pad set includes a plurality of holes, wherein the plurality of holes are disposed above each of the devices under test in each of the first array, and wherein the holes are larger than the devices under test; and
a selection circuit connected to each of the devices under test in the first array and the gate force pad, wherein the selection circuit is configured to selectively connect each of the devices under test in the first array to the gate force pad.

11. The layout of claim 10, further comprising:
one or more metal layers formed between the first and second layers, wherein the one or more metal layers interconnect the devices in the first array and the gate pad, the source pad, and the drain pad in the first pad set.

12. A layout for devices under test formed on a semiconductor wafer for use in wafer testing, the layout comprising:
a first array of devices under test;
a second array of devices ender test;
a second pad set formed adjacent to the second array, the second pad set including a gate force pad, a source pad, and a drain pad,
wherein each of the devices under test in the second array is connected in parallel to the source pad of the second pad set, and
wherein each of the devices under test in the second array is connected in parallel to the drain pad of the second pad set;
a set of control logic connected to the first and second arrays, wherein the set of control logic is configured to test a device under test in the first array is parallel with a device under test in the second array, test all the devices under test in the first array individually in series, and test all the device under test in the second array individually in series.

13. The layout of claim 12, wherein the first and second arrays are tested in parallel.

14. The layout of claim 12, wherein the first and second arrays, the first and second pad sets, the set of control logic, and the third pad set are formed along a scribe line on the wafer.

15. A layout for devices under test formed on a semiconductor wafer for use in wafer testing, the layout comprising:
a first array of devices under test;
a first pad set formed adjacent to the first array, the first pad set including a gate force pad, a source pad, and a drain pad,
wherein each of the devices under test in the first array is connected in parallel to the source pad of the first pad set, and
wherein each of the devices under test in the first array is connected in parallel to the drain pad of the first pad set;
forming integrated circuit dice on a wafer using an integrated circuit fabrication line;
a second array of devices under test;
a second pad set formed adjacent to the second array, the second pad set including a gate force pad, a source pad, and a drain pad,
wherein each of the devices under test in the second array is connected in parallel to the source pad of the second pad set, and
wheerein each of the devices under test in the second array is connected in parallel to the drain pad of the second pad det;
a set of control logic connected to the first and second arrays, wherein the set of control logic is configured to test a device under test in the first array in parallel with a device under test in the second array, test all the devices under test in the first array individually in series, and test all the device under test in the second array individually in series.

16. The layout of claim 15, wherein the first pad set is formed vertically above the first array, and wherein the second pad set is formed vertically above the second array.

17. The layout of claim 16, wherein the set of control logic is formed between the first and second arrays, and further comprising:
a third pad set formed vertically above the set of control logic and between the first and second pad sets.

18. A layout of claim 17, wherein the first and second arrays, the first and second pad sets, the set of control logic, and the third pad set are formed along a scribe line on the wafer.

19. A method of forming a layout for devices under test formed on a semiconductor wafer for use in wafer testing, the method comprising:
forming a first away of devices under test;
forming a first pad set adjacent to the first array, the first pad set including a gate force pad, a source pad, and a drain pad,
wherein each of the devices under test in the first array is connected in parallel to the source pad of the first pad set, and
wherein each of the devices under test in the first array is connected in parallel to the drain pad of the first pad set;
forming a second array of devices under test;
forming a second pad set adjacent to the second array;
forming a set of control logic;
forming a third pad set above the set of control logic; and
forming a selection circuit connected to each of the devices under test in the first array and the gate force pad, wherein the selection circuit is configured to selectively connect each of the devices under test in the first array to the gate force pad.

20. The method of claim 19, wherein the first pad set is formed vertically above the first array, wherein the second pad set is formed vertically above the second array, wherein the third pad set is formed vertically above the set of control logic.

21. The method of claim 20, wherein the set of control logic is formed between the first and second arrays, and the third pad set is formed between the first and second pad sets, and wherein the first and second arrays, the first and second pad sets, the set of control logic, and the third pad set are formed along a scribe line on the wafer.

22. The method of claim 19, wherein the set of control logic is configured to test a device under test in the first away in parallel with a device under test in the second array, test all the devices under test in the first array individually in series, and test all the device under test in the second away individually in series.

23. A method of forming a layout for devices under test formed on a semiconductor wafer for use in wafer testing, the method comprising:
forming integrated circuit dice on a wafer using an integrated circuit fabrication line;
forming a first away of devices under test in a scribe line on the wafer using the integrated circuit fabrication line;
forming a first pad set adjacent to the first away in the scribe line on the wafer using the integrated circuit fabrication line, the first pad set including a gate force pad, a source pad, and a drain pad,
wherein each of the devices under test in the first array is connected in parallel to the source pad of the first pad set,
wherein each of the devices under test in the first array is connected in parallel to the drain pad of the first pad set,
wherein the first array is formed in a first layer on the wafer, wherein the first pad set is formed in a second layer, wherein the second layer is formed above the first layer, and wherein the first pad set is formed above the first array, and
wherein each of the gate pad, the source pad, and the drain pad of the first pad set includes a plurality of holes, wherein the plurality of holes are disposed above each of the devices under test in each of the first array, and wherein the holes are larger than the devices under test;
forming a selection circuit in the scribe line on the wafer using the integrated circuit fabrication line, wherein the selection circuit is connected to each of the devices under test in the first array and the gate force pad, wherein the selection circuit is configured to selectively connect each of the devices under test in the first away to the gate force pad;
after forming the integrated circuit dice, the first array, the first pad set, and the selection circuit on the wafer, testing all the devices under test in the first array individually in series using the selection circuit;
after testing all the devices under test, dicing the integrated circuit dice on the wafer along scribe lines into integrated circuit chips; and
packaging the integrated circuit chips.

24. The method of claim 23, further comprising:
processing test data generated from testing all the devices under test, wherein the processing of data includes evaluating or controlling a semiconductor fabrication process.

25. A method of forming a layout for devices under test formed on a semiconductor wafer for use in wafer testing, the method comprising:
formint integrated circuit dice on a wafer using an integrated circuit fabrication line;
forming a first away of devices under test in a scribe line on the wafer using the integrated circuit fabrication line;
forming a first pad set adjacent to the first array in the scribe line on the wafer using the integrated circuit fabrication line, the first pad set including a gate force pad, a source pad, and a drain pad,
  wherein each of the devices under test in the first array is connected in parallel to the source pad of the first pad set, and
  wherein each of the devices under test in the first array is connected in parallel to the drain pad of the first pad set;
forming a second array of devices under test;
forming a second pad set adjacent to the second array;
forming a set of control logic;
forming a third pad set above the set of control logic;
forming a selection circuit in the scribe line on the wafer using the integrated circuit fabrication line, wherein the selection circuit is connected to each of the devices under test in the first array and the gate force pad, wherein the selection circuit is configured to selectively connect each of the devices under test in the first array to the gate force pad;
after forming the integrated circuit dice, the first array, the first pad set, and the selection circuit on the wafer, testing all the devices under test in the first array individually in series using the selection circuit;
after testing all the devices under test, dicing the integrated circuit dice on the wafer along scribe lines into integrated circuit chips; and
packaging the integrated circuit chips.

26. The method of claim 25, further comprising:
processing test data generated from testing all the devices under test, wherein the processing of data includes evaluating or controlling a semiconductor fabrication process.

* * * * *